United States Patent

Manos, II

(10) Patent No.: US 9,704,765 B2
(45) Date of Patent: Jul. 11, 2017

(54) METHOD OF CONTROLLING ETCH-PATTERN DENSITY AND DEVICE MADE USING SUCH METHOD

(71) Applicant: Polar Semiconductor, LLC, Bloomington, MN (US)

(72) Inventor: Peter N. Manos, II, Eden Prairie, MN (US)

(73) Assignee: Polar Semiconductor, LLC, Bloomington, MN (US)

( * ) Notice: Subject to any disclaimer, the term of this patent is extended or adjusted under 35 U.S.C. 154(b) by 179 days.

(21) Appl. No.: 14/814,703

(22) Filed: Jul. 31, 2015

(65) Prior Publication Data

US 2017/0033022 A1    Feb. 2, 2017

(51) Int. Cl.

| H01L 29/10 | (2006.01) |
|---|---|
| H01L 21/66 | (2006.01) |
| H01L 29/78 | (2006.01) |
| H01L 29/04 | (2006.01) |
| H01L 29/16 | (2006.01) |
| H01L 21/02 | (2006.01) |
| H01L 21/3065 | (2006.01) |
| H01L 21/308 | (2006.01) |
| H01L 21/265 | (2006.01) |
| H01L 21/306 | (2006.01) |
| H01L 29/66 | (2006.01) |

(52) U.S. Cl.
CPC ........ *H01L 22/26* (2013.01); *H01L 21/02532* (2013.01); *H01L 21/02595* (2013.01); *H01L 21/26513* (2013.01); *H01L 21/308* (2013.01); *H01L 21/3065* (2013.01); *H01L 21/30625* (2013.01); *H01L 22/12* (2013.01); *H01L 29/04* (2013.01); *H01L 29/16* (2013.01); *H01L 29/66681* (2013.01); *H01L 29/7816* (2013.01)

(58) Field of Classification Search
CPC ....................................................... H01L 29/10
See application file for complete search history.

(56) References Cited

U.S. PATENT DOCUMENTS 8,183,126 B2 * 5/2012 Lee ....................... H01L 27/101
257/379
8,896,070 B2 * 11/2014 Lee ....................... H01L 27/101
257/379

* cited by examiner

*Primary Examiner* — Marvin Payen
(74) *Attorney, Agent, or Firm* — Kinney & Lange, P.A.

(57) ABSTRACT

A method of controlling an etch-pattern density of a polysilicon layer includes depositing polysilicon on a wafer. The method includes determining polysilicon-etch regions that include DMOS source regions within circuit-device areas of the wafer. The method includes calculating an etch area of the polysilicon-etch regions and then comparing the calculated etch area of the polysilicon-etch regions to a predetermined minimum etch area. If the calculated etch area is less than a predetermined threshold, the method adds polysilicon-etch regions within non-circuit-device areas to the determined polysilicon-etch regions within the circuit-device areas until the comparing step results in the calculated etch area of the polysilicon-etch regions being greater than the predetermined minimum etch area. The method includes etching the polysilicon from the polysilicon-etch regions in both the circuit-device areas and the non-circuit-device areas. Adding polysilicon-etch regions in non-circuit device areas can advantageously facilitate automatic process control of an etch step.

20 Claims, 9 Drawing Sheets

METHOD OF CONTROLLING ETCH-PATTERN DENSITY AND DEVICE MADE USING SUCH METHOD

BACKGROUND

Integrated circuits are made using various fabrication technologies. Fabrication facilities can use semiconductor wafers as a starting material and produce finished integrated circuits. Integrated circuit fabrication facilities can have many different pieces of equipment for performing many different processing steps. Fabrication facilities can employ a single integrated circuit process or many different integrated circuit processes. Various processing steps can be employed in manufacturing an integrated circuit. Epitaxial deposition, oxidation, diffusion, ion implantation, thin film deposition, etching of various layers, and photo-lithography are some of the processing steps that can be used in manufacturing an integrated circuit.

Thin film deposition of polysilicon is used in the manufacture of some integrated circuits. Complementary Metal Oxide Semiconductor (CMOS) circuits, for example, can use patterned structures of a polysilicon layer as gates. Control of finished dimensions can be an important factor in controlling the performance of an integrated circuit. The length of the active gate of a CMOS device is one such dimension. Thus, controlling the active gate length of a CMOS device can determine the performance realized by the integrated circuit.

SUMMARY

Apparatus and associated methods relate to controlling an etch-pattern density of a polysilicon layer on a surface of a semiconductor wafer for facilitating process control of a polysilicon-etch processing step. The method includes a step of depositing the polysilicon layer on the surface of the semiconductor wafer. The semiconductor wafer can include circuit-device areas and non-circuit-device areas. Circuit-device areas have active or passive electronic devices manufactured thereon, and non-circuit-device areas have no active or passive electronic devices manufactured thereon. The method includes a step of determining polysilicon-etch regions within circuit-device areas. The determined etch-regions can include one or more source regions of one or more DMOS devices. The method includes a step of calculating an etch area of the polysilicon-etch regions. The method further includes the step of comparing the calculated etch area of the polysilicon-etch regions to a predetermined minimum etch area. Additional polysilicon-etch regions within non-circuit-device are added to the determined polysilicon-etch regions within circuit-device areas until the comparison results in a calculated etch area of polysilicon-etch regions that is greater than the predetermined minimum etch area. The method further includes a step of etching the polysilicon from the polysilicon-etch regions in both the circuit-device areas and the non-circuit-device areas.

In an exemplary embodiment, a semiconductor device is made by the method of the above described exemplary methods. The semiconductor device can further include circuit-devices, such as, for example, one or more DMOS devices. The one or more DMOS devices have a source, a drain, and a polysilicon gate. Each of the polysilicon gates has an active gate length. Each of the active gate lengths is determined on one end by an edge of the polysilicon gate created by the etching step. The semiconductor device includes circuit-device polysilicon structures that overlap circuit-device areas and are electrically connected to at least one of the circuit-devices. The semiconductor device includes non-circuit-device polysilicon structures that do not overlap circuit-device areas. When the semiconductor device is operating, the non-circuit-device polysilicon structures can carry substantially zero current. The non-circuit-device polysilicon structures, for example, can be electrically connected to a substrate or to a supply pad.

In some embodiments, a semiconductor device includes a top surface having a top-surface area divided into circuit-device areas having active or passive electronic devices manufactured thereon and non-circuit-device areas having no active or passive electronic devices manufactured thereon. The semiconductor device includes a polysilicon layer that has been selectively etched leaving un-etched polysilicon structures that include both circuit-device polysilicon structures and non-circuit-device polysilicon structures. Each of the circuit-device polysilicon structures overlaps one of the circuit-device areas and is electrically connected to one of the active or passive electronic devices. Each of the non-circuit-device polysilicon structures does not overlap a circuit-device area.

Some exemplary semiconductor devices can include one or more DMOS devices. Each of the one or more DMOS devices has a source, a drain, and a polysilicon gate. The source has a doubly-diffused implant masked on one end by the polysilicon gate. The doubly-diffused implant includes both a p-type dopant species and an n-type dopant species. Each of the polysilicon gates has a gate length determined on one end by an etched edge of the one end of the polysilicon gate. A ratio of an area of both the circuit-element polysilicon structures and the non-circuit-element polysilicon structures to the top-surface area of the semiconductor device can be greater than a predetermined threshold. The semiconductor device further includes a substrate-contact region having the doubly-diffused implant. The substrate contact region has an additional p-plus implant counter-doping the n-type dopant species of the doubly-diffused implant. A dose of the p-type implant is sufficient to invert the net doping of the substrate-contact region in which the n-type dopant species resides.

DETAILED DESCRIPTION

Figure 1:
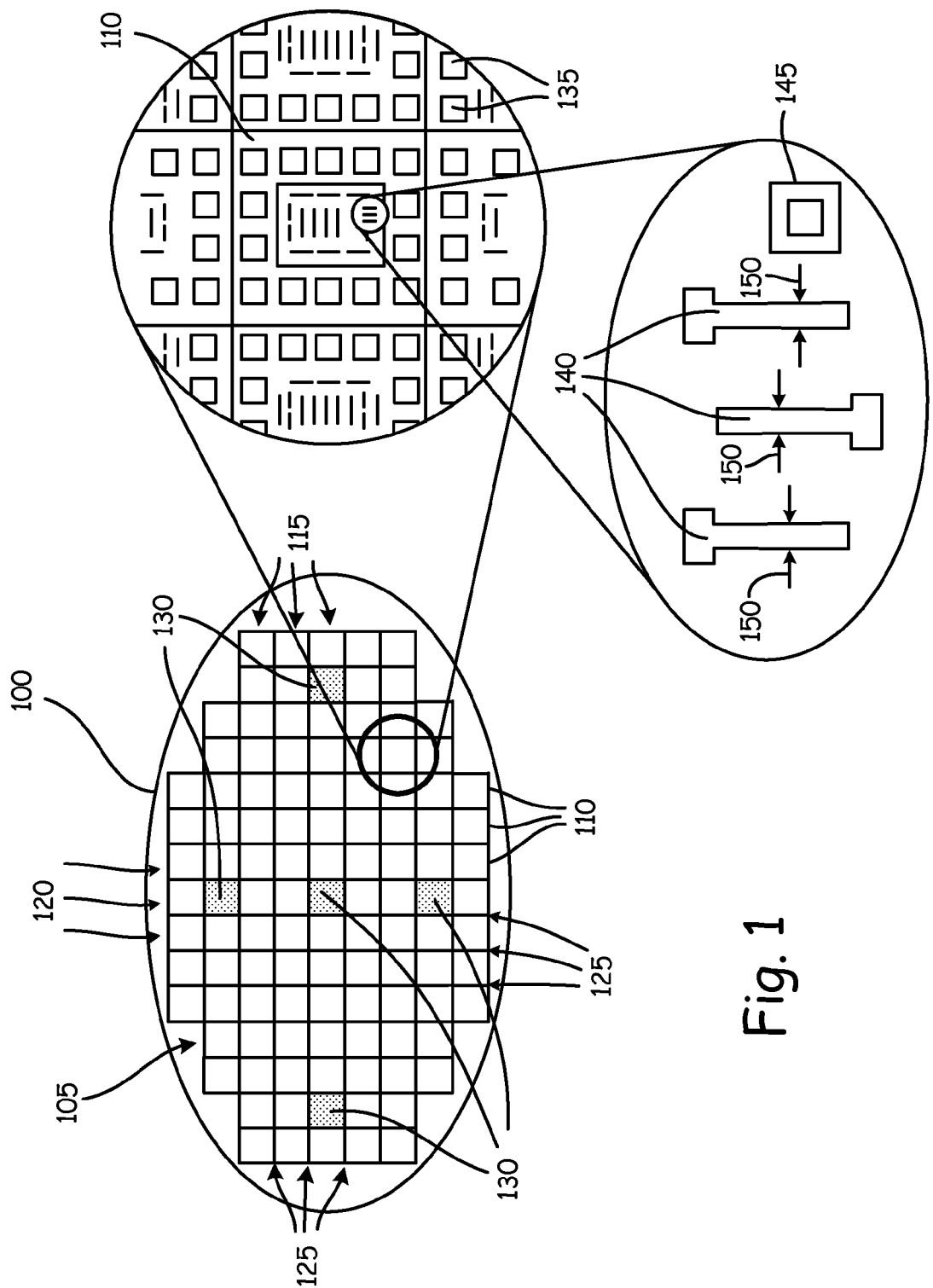
FIG. 1 is a schematic view of a semiconductor wafer immediately after etching of a polysilicon layer showing well-controlled finished dimensions due to improved control of an etch-pattern density.

An etch-pattern density of a polysilicon layer that is used for DMOS gates can be controlled by identifying regions that require etching for creating circuit-device polysilicon features (e.g., a polysilicon gate, resistor, capacitor plate, etc.) as well as selecting additional regions away from and/or unrelated to circuit devices. These additional or sacrificial regions can be distributed throughout an integrated circuit and/or a semiconductor wafer to improve uniformity of the polysilicon layer exposed to or presented to etch chemicals. These sacrificial regions can also increase a polysilicon area that is exposed to or presented to the etch chemicals.

Each unique process formula for creating a microelectronic circuit can have one or more processing steps that are intimately related and/or identically patterned to one another. For example, photoresist can be deposited on a top surface of a wafer and then patterned to mask two subsequent processing steps: i) the exposed polysilicon regions can be etched by an etching step; and ii) a dopant can be implanted into the etched regions. The photoresist can then be removed from the wafer after all of the identically-patterned processing steps have been performed. The above described steps of selectively etching polysilicon and selectively implanting a dopant species are intimately related, in this case by using the same photoresist mask. Such an implant is collateral to the particular polysilicon etch or the polysilicon etch is collateral to the particular implant, for example.

Selecting sacrificial polysilicon regions in non-circuit-device areas to be etched can incur the consequences that are collateral to the etching step, such as receiving a subsequent dopant implantation. Some non-circuit-device areas can be entirely intolerant of a consequences of the polysilicon etch or other intimately related processing steps. Some non-circuit-device areas can require corrections for any undesirable collateral consequences of the polysilicon etch. Some non-circuit-device areas might be able to be processed by the etching step as well as all collateral processing steps without requiring other processing steps to correct for the consequences of the etching step and its related processing steps. This specification will identify two types of non-circuit-device regions (i.e., those requiring corrective steps and those not requiring corrective steps) that can provide polysilicon real estate for controlling a polysilicon pattern density.

In some embodiments, isolation-grid regions can be selected as non-circuit-device areas for use in controlling a polysilicon-etch density. Field oxide regions can, in certain circumstances, be used as non-circuit-device areas to control pattern densities. In some embodiments, bond-pad areas, scribe-street areas and/or drop-in test locations can be selected as non-circuit-device areas for use in controlling a polysilicon-etch-pattern density.

Controlling an etch-pattern density of a polysilicon layer can have one or more advantages. Improving the uniformity of the polysilicon exposed to the etch chemicals can improve the spatial uniformity of an etching rate. In some embodiments, such an improved spatial uniformity of the etching rate can improve the uniformity of finished polysilicon dimensions. Improving etch-rate uniformity can permit tighter product specifications, and tighter product specifications can result in a commercially advantageous product having a higher circuit-performance specification. In some embodiments, smaller etched features and/or smaller finished geometries can be manufactured as a result of improved uniformity of an etch-pattern. Smaller finished circuits then can result in higher-yielding circuits. These in turn can result in lower costs of manufacturing and/or products.

Many of the same advantages can accrue as a result of increasing an etch-pattern density for etching. Increasing the area of polysilicon exposed to the etch chemicals can increase the detectability of reaction products during a polysilicon-etching step. An automated process controller can detect the reaction products and generate a signal corresponding to a measure of the detected reaction products. The increased etch-pattern density can result in an increase in the amplitude of this signal used for automated process control of an etching station, for example. The increased signal magnitude used for automated process control can result in an improvement in the signal-to-noise ratio of such a signal. The increased signal magnitude can also improve the precision of a detection of an end point of the etching process.

Improving the uniformity of a polysilicon pattern and/or increasing the polysilicon-pattern density can advantageously improve a uniformity of a subsequent chemical-mechanical-planarization (CMP) processing step. Intra-die planarization, both local and global can be improved as well as wafer level planarization by improving the polysilicon pattern uniformity. Because the planarization uniformity can be improved, thinner planarized glass can be achievable. Using a thinner planarized glass can permit contacts to both the polysilicon and to the semiconductor that have lower resistance and/or better step coverage. Such contacts can also exhibit better reliability.

Figure 6:
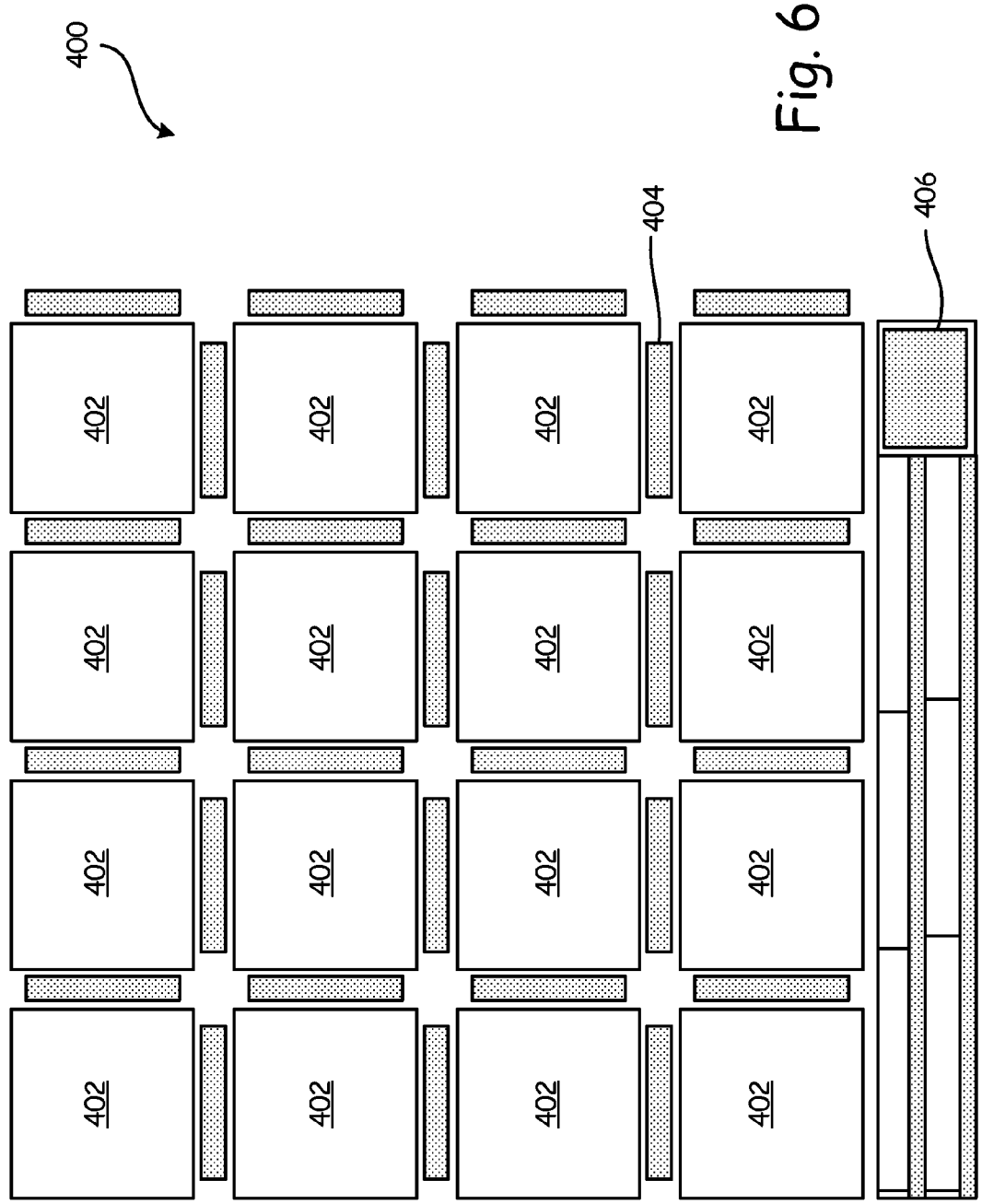
FIG. 6 is a plan view of a portion of a semiconductor wafer showing an array of product die, scribe streets and drop-in test structures.
Figure 7:
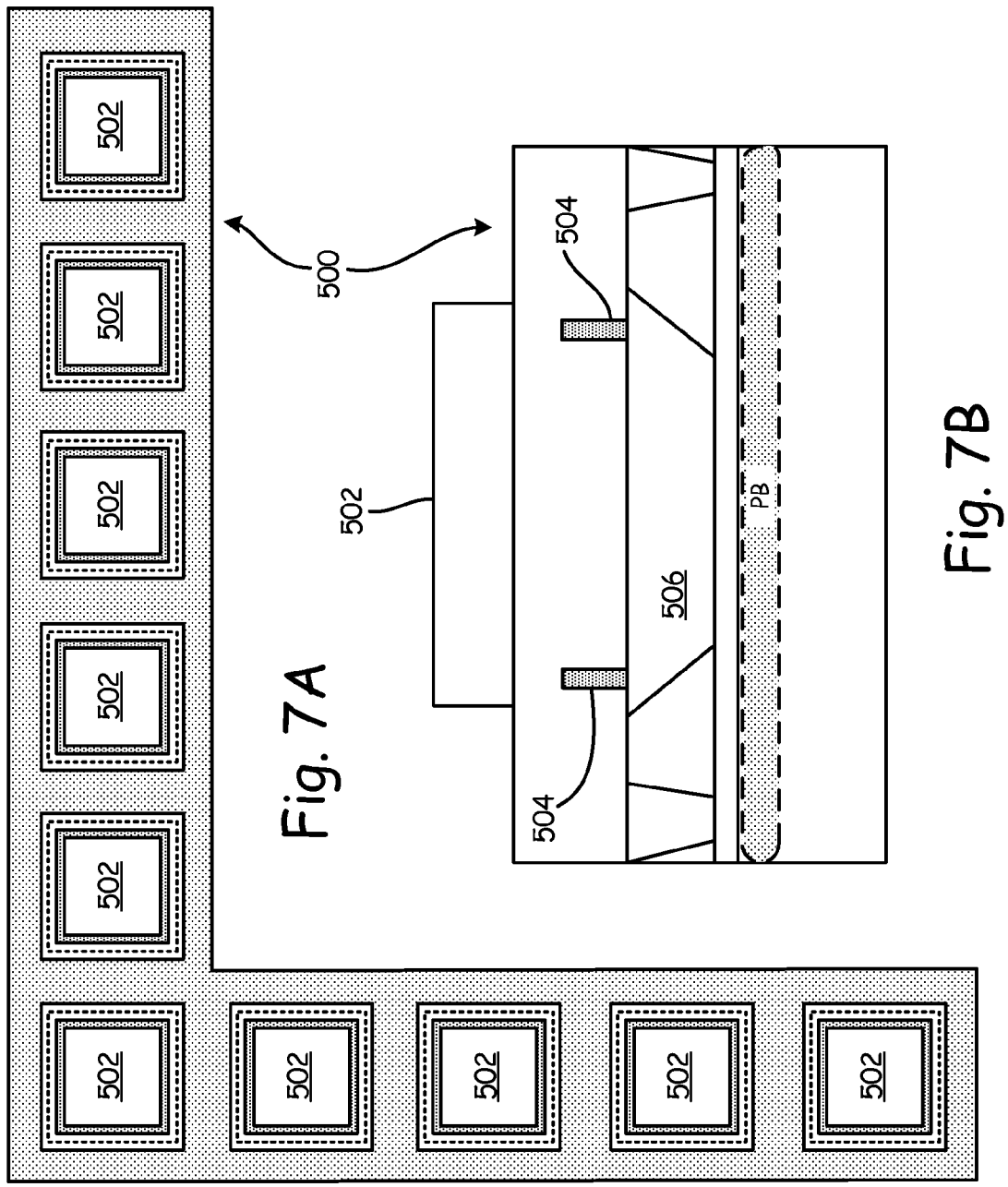
FIGS. 7A-7B are plan and cross-sectional views, respectively, of a product die showing polysilicon fence structures remaining after etching polysilicon from bond pad locations.
Figure 8:
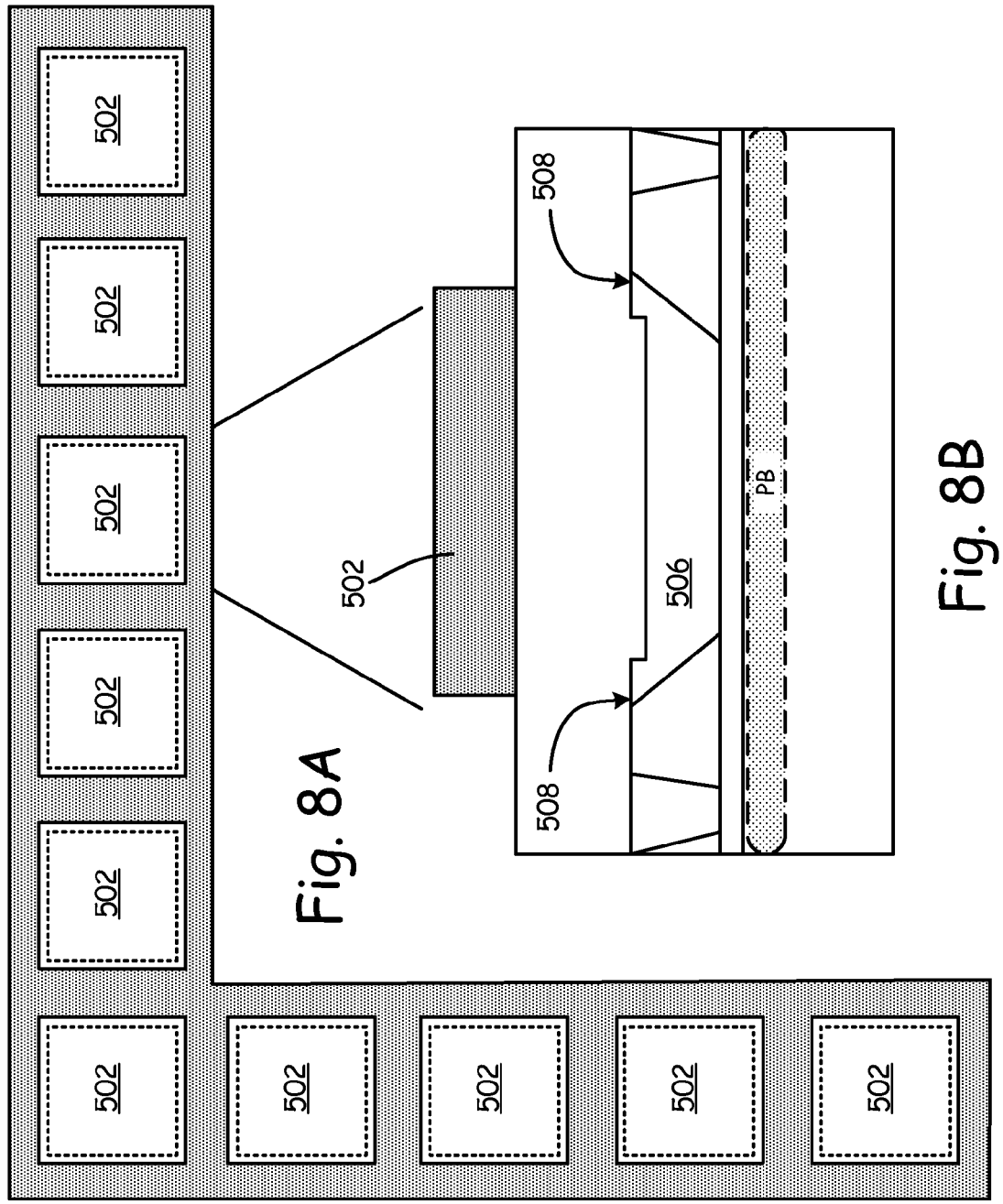
FIGS. 8A-8B are plan and cross-sectional views, respectively, of a product die showing an etch-step remaining after etching polysilicon from bond pad locations.

In this specification, an exemplary method of controlling a polysilicon etch-pattern density will be shown to advantageously facilitate process control. First, with reference to FIG. 1, an exemplary wafer showing a substantially uniform polysilicon pattern density using such a method is depicted. Then, with reference to FIGS. 2-4, exemplary processing steps that realize this improved etch-pattern density will be described. In these figures, sacrificial etch structures will be located so as to overlap isolation-grid regions to increase the etch-pattern density. Then, with reference to FIG. 5, an exemplary dopant profile within an isolation-grid region will be detailed showing that a junctionless net dopant profile can be achieved in isolation-grid regions. Alternative methods of controlling a polysilicon etch-pattern density are described with reference to FIGS. 6-8. In FIG. 6, sacrificial polysilicon structures are shown in both scribe streets and in drop-in test locations. In FIGS. 7-8, sacrificial polysilicon structures are located overlapping bond pad regions of a die. Finally, with reference to FIG. 9, alternative substrate-contacting structures are described for providing increased flexibility in control of a polysilicon etch-pattern density and/or a polysilicon pattern density.

FIG. 1 is a schematic view of a semiconductor wafer immediately after etching of a polysilicon layer showing well-controlled finished dimensions due to improved control of an etch-pattern density. In FIG. 1, semiconductor wafer 100 includes rectangular array 105 of product dice 110. Product dice 110 are arranged in rows 115 and columns 120, and separated from one another by horizontal and vertical scribe streets 125. Semiconductor wafer 100 also has five drop-in test structures 130 which are processed in five different locations in rectangular array 105. Each product die 110 has a series of bond pads 135 located around an outer perimeter of product die 110. In the interior of each product die 110 are many discrete polysilicon structures 140 that are associated with active and/or passive circuit devices. Additional polysilicon structures 145, which are not associated with an active or passive circuit device, are distributed throughout semiconductor wafer 100. Such additional polysilicon structures 145 can be located in regions where few or no device-related polysilicon structures 140 reside, thereby improving uniformity of a pattern density. Because the discrete polysilicon structures are distributed in a substantially uniform fashion throughout the die and wafer, etching of polysilicon structures 140, 145 can be subject to improved process control. This improved process control can help realize polysilicon-structure dimensions 150 that are within tight specification limits. Furthermore, subsequent chemical mechanical planarization (CMP) of the wafer can advantageously result in improved uniformity of glass thickness due to the substantial uniformity of polysilicon structures 140, 145.

Device-related polysilicon structures 140 can be used in various ways on a semiconductor device. For example, a polysilicon layer can be patterned as a gate of a metal oxide semiconductor (MOS) device, for example. Some of polysilicon structures 140 can also be used as resistive elements in electrical circuits. Some of polysilicon structures 140 can be used as a top and/or bottom plate of a capacitor in an electrical circuit, for example.

To understand how controlling an etch pattern can advantageously facilitate better process control, a brief exposition of some exemplary processes will now be discussed. In some exemplary process technologies, one layer of polysilicon can be deposited for use in one or more electrical component structures. In other exemplary process technologies, two or more layers of polysilicon can be deposited for use as one or more various device components. When a circuit is physically planned and/or laid-out on a wafer, the resulting distribution of various types of structures might not be uniform throughout. In some layouts, for example, one region of the wafer might contain a high density of a structural feature, while another region of the wafer might have few or no such structural features. The polysilicon structures on a wafer before and/or after etching can be non-uniformly distributed throughout the die and/or wafer. Such non-uniform distributions can negatively affect process control.

Some processes can include a single etching step for a single layer of polysilicon. For example, an exemplary CMOS process can use polysilicon for MOS gates and for capacitor top-plates. An exemplary semiconductor circuit using such a process can define a number and locations and geometries of all desired circuit structures for proper circuit operation. A mask can be made that contains a topographical image of these desired circuit structures. The mask can be used to provide selective exposure and removal of a photoresist material coated upon a polysilicon layer on the top surface of the wafer. Then, the selectively exposed polysilicon can be chemically and/or physically etched to produce the desired polysilicon circuit structures.

To chemically etch the polysilicon, the photoresist-patterned wafer can then be exposed to reaction chemicals that etch polysilicon. Any exposed polysilicon regions can then be etched. At the beginning of the etching step, only exposed regions of the polysilicon will contact the etching chemicals. But as the etching step progresses, the chemicals can contact and react with polysilicon underneath the edges of the photoresist pattern. In this way, the fidelity of the pattern of the etched polysilicon to the photoresist mask can become distorted as the etching step progresses. If the wafer is over-etched, for example, the mask-protected structures can be undersized as the edges of such structures have been laterally etched from beneath the edges of the photoresist mask.

A reaction rate of many chemical reactions can be related to the amount of reactants present. For example, reaction rates can be high when chemical reactants are more abundant, and reaction rates can be low when chemical reactants are more scarce. Reaction rates can be functionally dependent on temperature. For example, reaction rates can increase in response to increasing temperature. Regulating such reaction-dependent parameters can provide for good control of the reaction.

In regions of a wafer that have large areas of exposed polysilicon, the concentration of reactants can be locally depressed as reactants are locally consumed during the etching process. For example, as polysilicon is one of the reactants of the etch chemistry, the large exposed area presents a high concentration of one of the chemical reactants (polysilicon). The reactant that reacts with the polysilicon can be introduced externally from the wafer, such as for example, as a gas or liquid. This gaseous or liquid reactant can be locally reduced in the large areas of exposed polysilicon due to the high concentration of the polysilicon reactant in such regions. As the reaction continues, the concentration of the gaseous or liquid reactants can be depressed as these reactants are consumed. A local depression of the gaseous or liquid reactant concentration can then reside proximate such large areas of exposed polysilicon. Such micro-loading of an etching process can exist proximate such large areas of exposed polysilicon. This micro-loading can then result in a lower etching rate of the polysilicon in the large exposed areas compared with the etching rate of polysilicon in the small exposed areas, where no reactants have a depressed concentration.

Etching process control can be performed in various ways. In some embodiments, for example, the temperature of the wafer can be actively controlled. In some embodiments, the reactants can be introduced at a high flow rate to minimize the local depression of reactants during a reaction. In some embodiments, the pattern density of the exposed polysilicon can be controlled so as to be substantially uniform across a wafer, which can minimize any variation of the reactant concentration due to micro-loading during the etching process.

In some process technologies, the desired final dimensions of some polysilicon features can be very small. For example, in half micron CMOS technologies, final dimensions of minimum gate lengths, by definition, are approximately one-half of a micron. Even small variations in these finished dimensions can result in large variations in the performance of such half-micron devices. For example, a 0.05 micron variation in gate length can result in a 10% or greater variation in one or more performance parameters of such devices. Precise control of the etching process thus can be important in manufacturing integrated circuits with performance in accord with target design specifications.

Some exemplary processes can etch a single layer of polysilicon two or more different times during the processing of a semiconductor device. There are various reasons why a single layer of polysilicon might be etched in two or more different processing steps. For example, a single layer of polysilicon can be used for two or more different types of circuit devices, each of which having different processing requirements. A first device can require a deep implant, for example, having a correspondingly large thermal budget subsequent to etching a polysilicon feature, for example. A second device can require a shallow implant, permitting a small thermal budget subsequent to etching of its polysilicon features. The second device can therefore be etched and implanted subsequent to the etching and implantation associated with the first device, for example.

When a single layer of polysilicon is etched two or more times during a fabrication process, the sum of the etch-pattern densities of the two or more etching steps cannot exceed 100%, as each region of polysilicon can be removed only one time. As such, control of the etch-pattern density for each of the etching steps can impact the etch-pattern density of each other etching step, which either precedes or follows. Furthermore, the maximum etch-pattern density of each of the etching steps is usually smaller than the etch-pattern density for processes that only etch the polysilicon a single time. Low values of etch-pattern densities can cause difficulties in controlling an etching process, even if the etch pattern is uniformly distributed throughout a wafer. Therefore, it can be advantageous to balance the polysilicon that is etched among the various etchings steps so as to ensure that a minimum pattern density required for good process control is achieved for every etching step.

Various process-control techniques can be used to facilitate the repeatability of a semiconductor fabrication process. One exemplary method of controlling an etching process is to monitor one or more reaction products of a chemical reaction. As a reaction proceeds, the reactants can be consumed and products of the reaction can be produced. Consumption of the reactants can be indicated by a reduction in the concentration of the reaction products, for example. As the reaction nears completion, the production of the reaction products can slow. When a measurement of the reaction products falls below a predetermined threshold, the process reaction can be terminated or scheduled for termination. For example, when the measured concentration of the reaction products falls below a predetermined threshold, the reaction can be nearing completion. Such end-point detection can improve the repeatability of a polysilicon etching step, for example. If a pattern density of exposed polysilicon is low (e.g., less than about 5%), precision in the measurement of the reaction products can be low. Thus, it can be difficult to precisely determine when an endpoint condition is reached.

For some semiconductor processes, the patterned photoresist used to mask the polysilicon for an etching step can also be used as a mask for a subsequent processing step. For example, after etching source regions of DMOS devices, a D-well can be selectively implanted into those same etched source regions. In such a scenario, the patterned photoresist can be intentionally left on the wafer for presenting the identical mask to an ion implanter as was presented to the polysilicon etching apparatus. Thus, even though a single layer of polysilicon can be etched two or more times in creating the final polysilicon structures, each etching step can be different from each other etching step due to other processing steps that are intimately related to one of the particular etching step. Therefore, it can be necessary to etch specific features during a specific one of the etching steps, the etching steps being not interchangeable. Controlling exposed regions of polysilicon to improve process control can result in other processing steps to be performed in those same exposed regions. Thus, the process designer must consider the compatibility of all of the processing steps that will be performed when seeking areas for providing sacrificial polysilicon regions to an etching step.

Some semiconductor processes use composite masking steps to create self-aligned features of various circuit devices. For example, after masking and etching polysilicon gates of CMOS devices, source and drain implants can be performed on these CMOS devices. The source and drain dopant species, although desired in the source and drain regions of the CMOS devices, can be undesired in other circuit devices and/or regions. These implants can be desired only in specific locations of CMOS and/or other circuit devices. In such situations, a photoresist layer can be patterned such that only certain regions of the wafer will receive the implant species.

The photoresist can be patterned to expose an entire NMOS device for a source/drain implant of an n-type dopant, for example. The gate polysilicon of the exposed NMOS device can obstruct the n-type dopant from being implanted into the channel region beneath the polysilicon gate of the NMOS device, while the photoresist can simultaneously obstruct the n-type dopant from being implanted into the regions surrounding the NMOS device. Using both the gate polysilicon and the photoresist as implant masks can facilitate a self-aligning of the source and drain regions of the NMOS device to the gate and therefore to the channel region of the NMOS device. Thus, both the polysilicon gate and the photoresist can be used to mask various regions from implantation of the dopant species. Such composite masking also can be considered when selecting one of two or more etching steps to be used to etch different regions of polysilicon on a semiconductor wafer. Structures other than gate polysilicon can be used as masking agents as well, such as, for example, field oxide.

Figure 2:
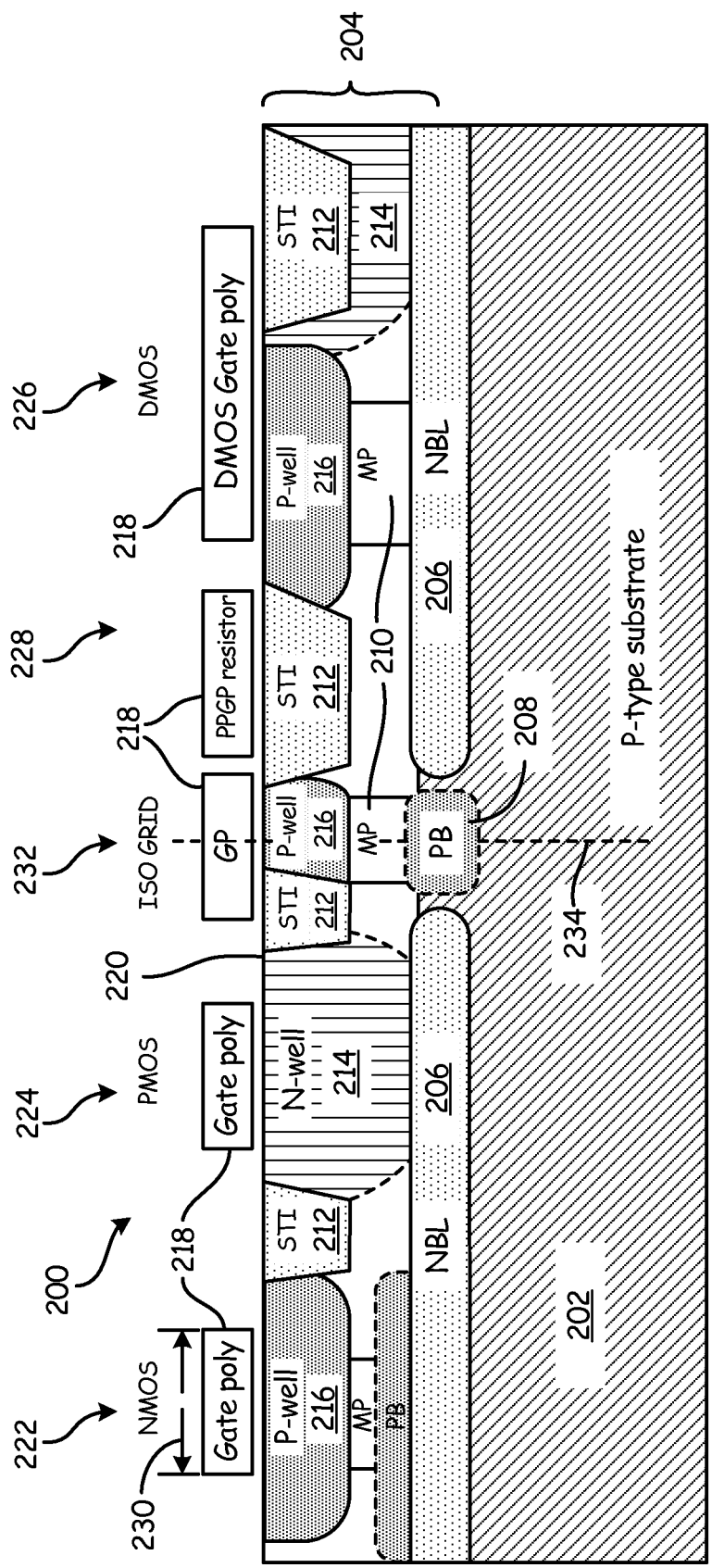
FIG. 2 is a cross-sectional view of a semiconductor wafer prior to photoresist masking used for a polysilicon etching step.

An exemplary integrated-circuit process that uses sacrificial polysilicon regions to improve etch-process density will be described, with reference to FIGS. 2-4. The exemplary process described here, with reference to FIGS. 2-4, uses exemplary processing steps that can facilitate process control and thereby result in better feature dimension control. FIG. 2 is a cross-sectional view of semiconductor wafer 200 prior to photoresist masking used to mask a polysilicon etching step. In this figure, polysilicon 218 has already been etched at least one time, as evidenced by the presence of polysilicon 218 in only some locations. In FIG. 2, semiconductor wafer 200 is shown in cross-section. Semiconductor wafer 200 has p-type substrate 202 and n-type epitaxial layer 204. Before n-type epitaxial layer 204 is grown, n-type buried layer 206 and p-type buried layer 208 have been implanted into p-type substrate 202.

Epitaxial layer 204 has deep MP (mid-P) layer 210, designed to maintain a p-type net dopant concentration between the p-well and p-buried layers. Shallow-trench isolation regions 212 can be fabricated of a silicon insulator in some processes (e.g., silicon dioxide, silicon nitride, etc.). Shallow-trench isolation regions 212 can be used to provide lateral isolation between adjacent circuit devices, for example. Both n-well 214 and p-well 216 regions are shown in the depicted exemplary embodiment. A layer of polysilicon 218 is depicted on or above top surface 220 of n-type epitaxial layer 204. In some processes, polysilicon 218 can be deposited on top of a gate oxide in CMOS device regions, for example.

Semiconductor wafer 200 has been cross-sectioned so that four different circuit devices are sectioned therethrough: i) NMOS transistor 222; ii) PMOS transistor 224; iii) DMOS transistor 226; and iv) p-plus gate-poly resistor 228. The specific juxtapositions of the various structural elements described above are topographically coordinated to create each of the device types. For example, NMOS device 222 has polysilicon structure 218 (labeled. GP) that can operate as a gate of NMOS device 222. Gate length 230 can characterize the gate of NMOS device 222. Manufacturing of the various devices has not been completed in FIG. 2, as evidenced by a lack of source and drain regions for both NMOS device 222 and PMOS device 224.

As depicted in FIG. 2, the polysilicon has been etched to define polysilicon structures 218 associated with NMOS device 222 and PMOS device 224 as well as polysilicon structures 218 associated with p-plus gate-poly resistor 228 and DMOS device 226. In addition to these circuit device elements, FIG. 2 shows polysilicon structure 218 associated with isolation grid region 232. Isolation grid region 232 is a region that has contiguous net p-type doping from the top surface 220 of epitaxial layer 204 to p-type substrate 202. A contiguous region of net p-type doping can result in a junctionless region, thereby providing an ohmic electrical conduction path. Junctionless vertical path 234 of net p-type material can facilitate electrical contact of underlying p-type substrate 202 via the top surface 220 of semiconductor wafer 200.

Figure 3:
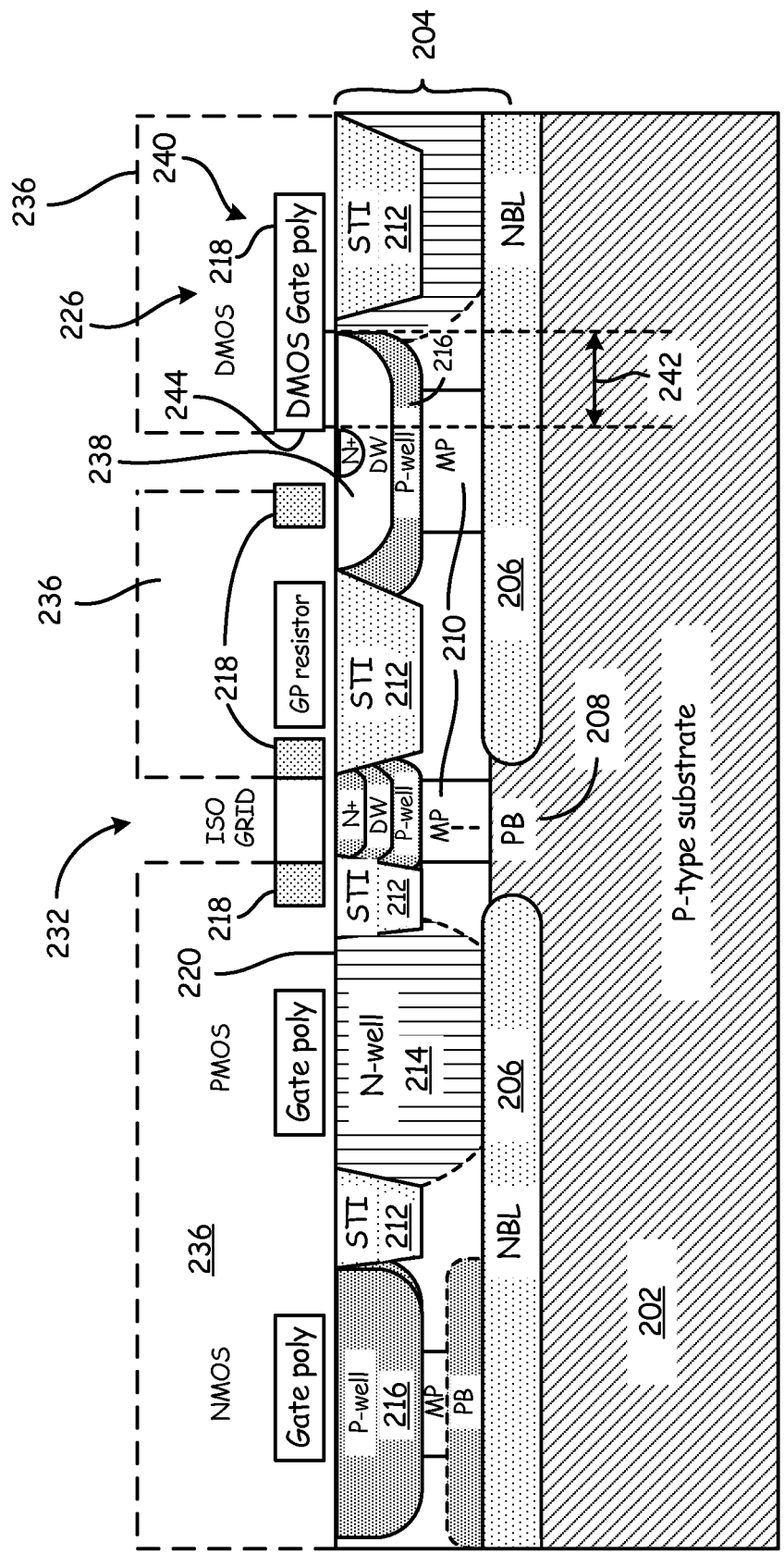
FIG. 3 is a cross-sectional view of a semiconductor wafer after a polysilicon etching step.

FIG. 3 is a cross-sectional view of semiconductor wafer 200 after a polysilicon etching step. FIG. 3 depicts the same portion of semiconductor wafer 200 as is depicted in FIG. 2. FIG. 3 depicts this cross-section of semiconductor wafer 200 after the polysilicon etching step and other processing steps have been performed. A layer of photoresist 236 has been patterned on semiconductor wafer 200. Photoresist 236 has been patterned to expose two exposed regions corresponding to two polysilicon structures 218 to be etched. Where polysilicon structures 218 have been exposed to the etching process, the polysilicon has been removed.

The two polysilicon structures 218 that have been exposed to the etching chemicals are associated with DMOS device 226 and with isolation grid 232. Polysilicon structure 218 associated with DMOS device 226 has been etched in source region 238 of DMOS device 226. A D-well has been implanted into n-type epitaxial layer 204 where exposed polysilicon structures 218 have been etched. The D-well includes both an n-type dopant species and a p-type dopant species.

The use of both dopant species can have one or more purposes. For example, the use of phosphorus as the n-type dopant species along with boron as the p-type dopant species has been known to promote boron diffusion. Boron can diffuse further with a phosphorus implant present than the boron would diffuse without the phosphorus implant, for example. Such enhanced diffusion of the boron can facilitate deeper junction formation, especially if a limited thermal budget is available for diffusion. A deeper (or more lateral) p-type region can be created when boron diffusion is so assisted by phosphorus, for example. Use of both dopant species can result in two pn-junctions that are self-aligned to one another. For example, the DMOS can have an n-type source and a p-type channel. The p-type channel forms a pn-junction both with the n-type source and with the n-type epitaxy. Both of these n-type junctions are self-aligned to one another and determined by the thermal diffusion of the D-well implant. Other n-type dopant species such as arsenic or antimony, for examples, can be used for such a doubly diffused structure as well, for example.

The boron can diffuse both vertically toward the substrate and laterally underneath etched end 244 of unetched polysilicon structure 218. The portion of polysilicon structure 218 that was protected from the etching chemicals by photoresist 236 can be intended to be used as gate 240 of DMOS device 226. This lateral diffusion of boron underneath gate 240 can determine active gate length 242 of DMOS device 226.

If active gate length 242 is so determined by the lateral diffusion of the boron, then active gate length 242 can be self-aligned with etched end 244 of gate 240. The proximal end of active gate length 242 can coincide with a pn-junction determined by the lateral diffusion under etched end 244 of gate 240 by an n-type species, while the distal end of active gate length 242 can be determined by the lateral diffusion under etched end 244 of gate 240 by a p-type species. Thus, both ends of the active gate are determined by etched end 244 of gate 240.

If the etching process is not well controlled, however, the distal front of the boron diffusing laterally underneath gate 242 can encounter an n-well or an oxide or some other object. When the distal front of the boron encounters such things, further lateral diffusion of the boron might not result in further lengthening active gate length 242, for example. In such cases, the two ends of the active gate might no longer be self-aligned with respect to each other. For example, one of the ends of the active gate might be determined by etched end 244 of polysilicon structure 218, while the other end of the active gate might be determined by a location of the n-well or other such obstacle. Thus, control of the location of etched edge 244 with respect to other features in semiconductor wafer 200 can improve control of active gate length 242 of DMOS device 226.

If only polysilicon structures 218 that are associated with DMOS devices 226 are etched during a polysilicon etching step, then only a small fraction of semiconductor wafer 200 can be exposed to the etching chemicals. In some exemplary semiconductor circuits, the etch-pattern density when etching only DMOS source regions can be less than about 7%, less than about 5%, or even less than about 1%. When etching such small fractions of the area of the wafer, process control can be difficult to automate. Automatic end-point detection methods can become inconsistent when low concentrations of reaction products are produced, for example.

To increase the etch-pattern density, regions in which a D-well implant can be performed without compromising the circuit's performance can be determined. FIG. 3 shows one such region: isolation grid region 232. One purpose of manufacturing isolation grid region 232 is to provide electrical conductivity from top surface 220 of semiconductor wafer 200 to underlying substrate 202. The circuit can be designed to operate with underlying substrate 202 maintained at a reference potential (e.g., ground), for example. To maintain substrate 202 at a specific voltage, however, an electrically conductive path to substrate 202 is created. Because substrate 202 is p-type in the depicted embodiment, a contiguous p-type path can provide ohmic contact from top surface 220 to underlying substrate 202.

The D-well implant, however, results in a relatively-shallow n-type region above a deeper p-type region. The relatively-shallow n-type region can be inverted by a subsequent implantation of a p-type dopant species, for example. Should such a net inversion be performed, a contiguous vertical p-type path would then be realized. As will be shown, with reference to FIG. 4 below, such a net inversion can be performed in various exemplary processes.

Figure 4:
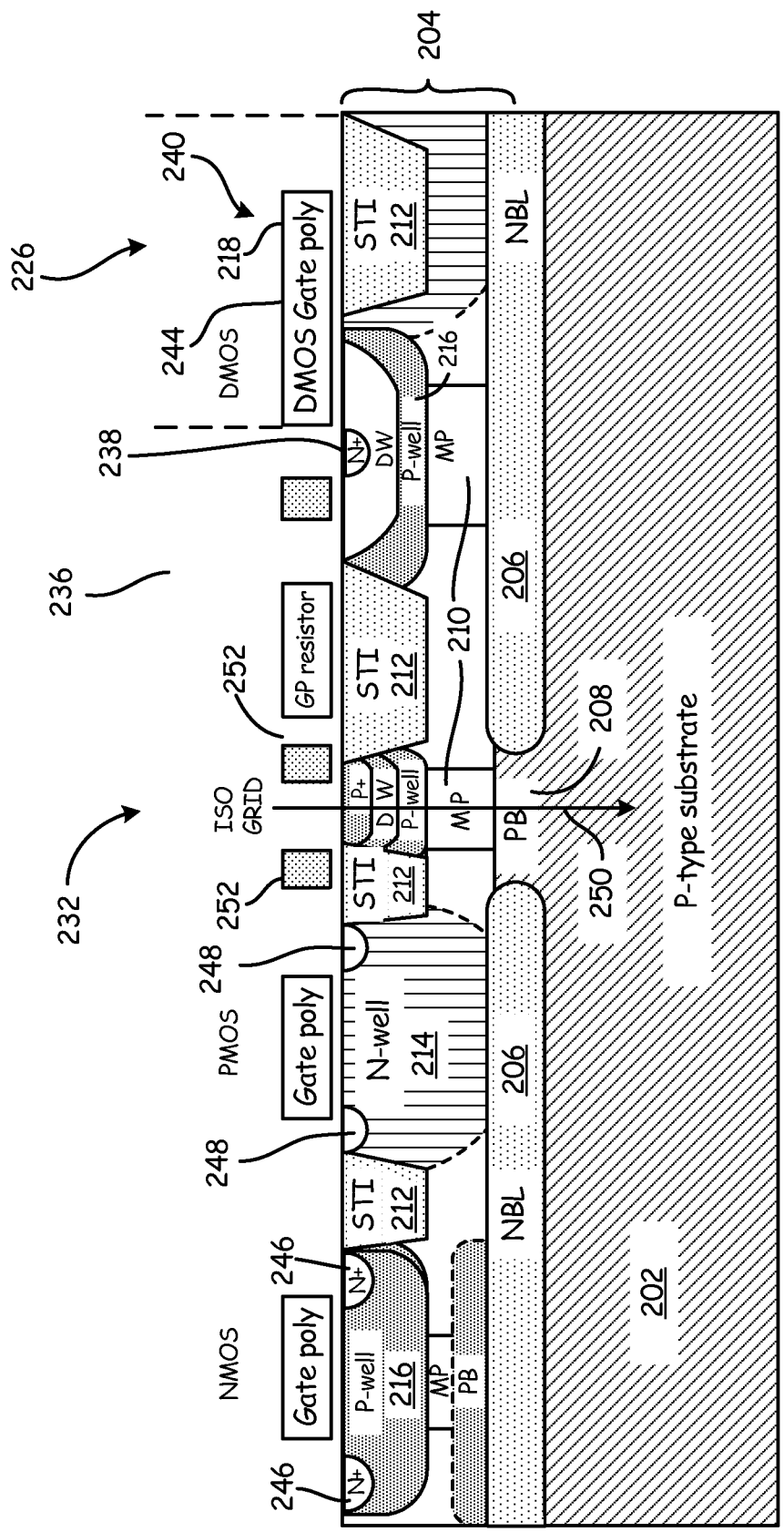
FIG. 4 is a cross-sectional view of a semiconductor wafer after a p-plus implant that counter-dopes a substrate contacting region.

FIG. 4 is a cross-sectional view of semiconductor wafer 200 after a p-plus implant has been performed, which counter-dopes a substrate contacting region. FIG. 4 is the same cross-sectional view depicted in FIGS. 2-3 but after one or more additional processing steps has been performed. In FIG. 4, device 222 now has n-type source and drain regions 246. PMOS device 224 also now has source and drain regions 248, albeit p-type regions. Isolation grid region 232 now is depicted as being p-type near top surface 220 of epitaxial layer 204. In some embodiments, the same implant as is used to create source/drain regions 248 of PMOS device 224 can be used to invert the n-type region of the D-well implant in isolation grid region 232. Various other p-type implants can be used instead of or in addition to the PMOS source drain implant. For example, in some exemplary processes, a bipolar device can have a base implant or a base enhancement implant that can be used to counter dope the n-type region of the isolation grid.

After inverting the n-type region of the D-well in isolation grid region 232, contiguous net p-type conduction path 250 is formed from top surface 220 of epitaxial layer 204 to underlying substrate 202. Polysilicon fences 252 remain on either side of isolation grid region 232 in the depicted embodiment. In some exemplary processes, the polysilicon can be masked differently which can result in removing the polysilicon in both isolation grid region 232 and the surrounding polysilicon fences 252.

Various process considerations can favor retaining or removing polysilicon fences 252. For example, if a larger etch-pattern density would improve the etching process control and thus the finished dimensions of the etched polysilicon, then patterning the polysilicon mask to expose fences 252 in addition to isolation grid regions 232 can help achieve that objective. If, however, a subsequent chemical mechanical planarization (CMP) step is to be performed, distributing polysilicon fences 252 throughout a wafer can improve the polysilicon pattern density and can facilitate better uniformity of the CMP, for example. Thus, control of both an etch-pattern density and a subsequent polysilicon-pattern density can each facilitate improved process control.

DMOS device 226 in FIG. 4 might appear similar to DMOS device 226 depicted in FIGS. 2-3. However, n-type source region 238 of DMOS device 226 might have been augmented with additional n-type dopants. For example, dopant species implanted into source/drain regions 246 of NMOS transistor 222 device might have been also implanted in source region 238 of DMOS device 226. In addition to using isolation grid regions as locations of sacrificial polysilicon, other non-device regions described below can be used with the boundaries of a product die for controlling pattern densities and pattern uniformities.

Figure 5:
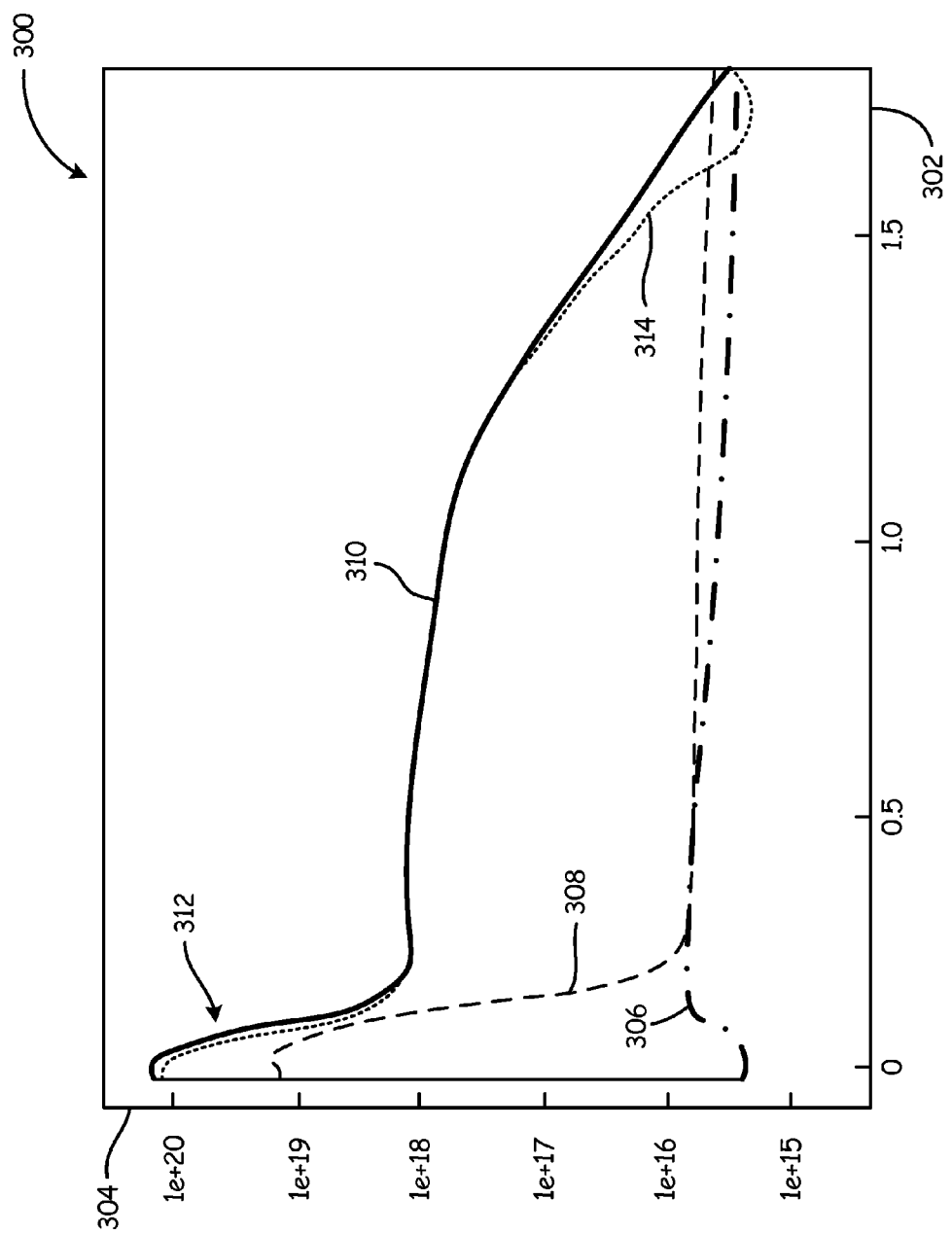
FIG. 5 is a graph of a dopant profile of a contiguous net p-type isolation grid region.

FIG. 5 is a graph of a dopant profile of the contiguous net p-type isolation grid region shown in FIG. 4. This figure illustrates how, in some embodiments, an undesirable dopant profile that collaterally results from a polysilicon etch masking step can be remedied by a subsequent implantation. In FIG. 5, graph 300 has horizontal axis 302 that represents a depth (μm) from top surface 220 of epitaxial layer 204 (FIG. 2). Graph 300 has vertical axis 304 that represents a dopant concentration ($cm^{-3}$). In the depicted embodiment, epitaxial layer 204 has substantially-uniform n-type dopant profile 306 of about $5 \times 10^{15}$ $cm^{-3}$. Near top surface 220 of epitaxial layer 204, the D-well has created n-type profile 308 that has a heavily-doped peak dopant concentration of about $1.5 \times 10^{19}$ $cm^{-3}$. The D-well has also created deep p-type profile region 310 having a peak dopant concentration of about $1 \times 10^{18}$ $cm^{-3}$. Deep p-type profile region 310 extends to more than 1.5 μm from top surface 220 of epitaxial layer 204.

An additional shallow but heavily-doped p-type region 312 has been formed to invert shallow n-type dopant profile 308 of the D-well implant. Heavily-doped p-type region 312 has a peak dopant concentration of about $1.7 \times 10^{20}$ $cm^{-3}$.

Lastly, net dopant-concentration profile 314 depicts the absolute value of the net dopant concentration as a function of the depth. Graph 300 does not depict the P-well and the MP regions that maintain the contiguous p-type profile below 1.5 μm.

FIG. 6 is a plan view of a portion of semiconductor wafer 400 showing an array of product dice, scribe streets and drop-in test structures. This figure can help demonstrate other non-circuit-device areas that can be used to provide sacrificial polysilicon and improve etching process uniformity. In FIG. 6, wafer portion 400 includes product dice 402, scribe street structures 404 and drop-in test structure 406. Using isolation-grid regions as potential locations of sacrificial polysilicon as described above can increase etch-pattern density and/or improve etch-pattern uniformity within product die 402. Furthermore, permitting polysilicon fences to remain on the die in various locations can increase polysilicon-pattern density and/or polysilicon-pattern uniformity within product die 402, as well.

Regions outside of product dice 402 can also be sources of improved etch-pattern density, etch-pattern uniformity, polysilicon-pattern density, and polysilicon-pattern uniformity throughout the whole semiconductor wafer 100 (FIG. 1). The scribe streets are spaces between adjacent product dice where the wafer can be broken or sawn to separate finished product dice one from another. Some exemplary semiconductor processes can use these scribe streets in various ways before the wafer is broken or sawn therethrough. For example, processing test structures can be used to provide feedback of various processing steps. Electrical test structures can be located in scribe streets. Such test structures can be tested after processing has been completed through the steps required for such electrical testing to be performed.

Scribe streets can also be rich sources of real estate for use in increasing/decreasing pattern densities and/or improving pattern uniformities. In some embodiments, isolation grid regions can be distributed throughout the scribe streets. Such isolation grid structures can then be permitted to retain sacrificial polysilicon regions to be etched. These sacrificial polysilicon regions can be used to control an etch-pattern of a wafer. Such etch-pattern control techniques can be used within scribe street structures 404 and/or within the scribe streets but outside the various scribe street structures 404. In addition to using isolation grid regions as locations of sacrificial polysilicon, other non-device locations described below can be used within scribe streets to control pattern densities and improve pattern uniformities.

In some processes, drop-in test structures can be located in dedicated locations on a wafer. For example, in an illustrative process, a drop-in test structure can be manufactured in a top location, a bottom location, a center location, a right location, and a left location on a wafer. In some exemplary processes, such drop-in test structures can substitute for product dice that otherwise could be manufactured in the drop-in test location. A drop-in test structure would in effect occupy a specific x-y location of a regular array of product dice, for example.

Drop-in test locations can also be rich sources of real estate for use in increasing/decreasing pattern densities and/or improving pattern uniformities. In some embodiments, isolation grid regions can be distributed throughout the drop-in test locations. Such isolation grid structures can then be permitted to retain sacrificial polysilicon regions to be etched. These sacrificial polysilicon regions can be used to control the etch-pattern of a wafer. Such etch-pattern control techniques can be used within the drop-in test locations.

FIGS. 7A-7B are plan and cross-sectional views, respectively, of a product die showing polysilicon fence structures remaining after etching polysilicon from bond pad locations. These figures can show exemplary ways bond-pad areas can be used to facilitate control of polysilicon patterns and thereby improve process control. In FIGS. 7A-7B a portion of product die 500 is shown having bond pads 502 distributed about a die periphery. Bond pads 502 can provide silicon real estate for controlling etch-pattern densities and/or polysilicon-pattern densities. In some processes, active-device circuitry is prohibited beneath bond pads 502. Bond pad locations can provide areas where sacrificial polysilicon can be located without reducing a total area available for active circuitry.

Because polysilicon is deposited uniformly on a wafer, every wafer location, including locations where bond pads will ultimately be fabricated, has polysilicon at some time during the processing. The bond-pad-located polysilicon can be etched when the CMOS gates are etched, in some exemplary processes. The bond-pad-located polysilicon can be exposed for etching when DMOS sources are etched, in some processes.

In the FIG. 7B depiction, a bond-pad-located polysilicon has been etched leaving only fence structures 504 of polysilicon remaining. The bond-pad-located polysilicon had resided on field oxide 506 of a shallow-trench isolation feature underneath the bond pad. The field oxide 506 might have been implanted with the D-well implant that is collateral to the polysilicon etching step, but of a relatively thick non-conductive material (e.g., silicon dioxide), as such an implant can be electrically inconsequential. Such field-oxide locations can provide significant areas of die real estate for control of both etch-pattern densities and polysilicon-pattern densities. The remaining polysilicon fence structures can be used to control a subsequent CMP processing step, for example.

FIGS. 8A-8B are plan and cross-sectional views, respectively, of a product die showing an etch-step remaining after etching polysilicon from bond pad locations. This figure depicts an alternative exemplary way that bond-pad locations can be used to improve polysilicon density and/or uniformity control. FIGS. 8A-8B depict the same portion of product die 500 as is depicted in FIGS. 7A-7B. In FIGS. 8A-8B, no polysilicon fence structures 504 remain. A particular polysilicon etching process can have etch selectivity, whereby polysilicon is etched more readily than field oxide by the etching reactants, for example. In FIG. 8B, slight step 508 is shown where an edge of a photoresist mask was used for exposing the wafer to the etching chemicals. Slight steps 508 might not be problematic features. Comparing FIG. 7B to FIG. 8B shows the latitude that a physical layout can have for providing various ways to control pattern densities and pattern uniformities.

Figure 9:
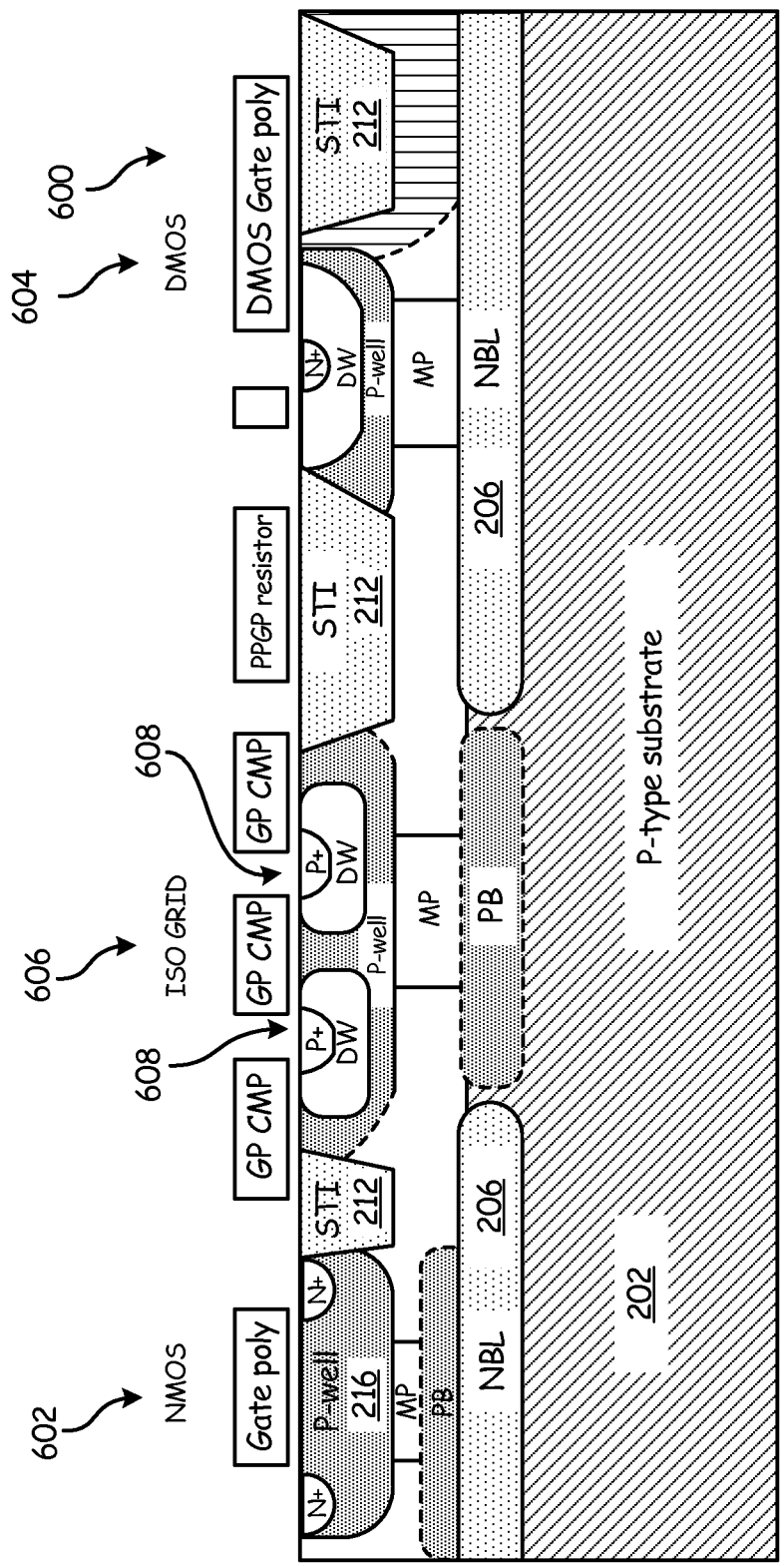
FIG. 9 is a cross-sectional view of a semiconductor wafer showing multiple substrate contacts in a substrate contacting region.

FIG. 9 is a cross-sectional view of a semiconductor wafer showing multiple substrate contacts in a substrate contacting region. This figure can help demonstrate how an etch-pattern density and a subsequent polysilicon-pattern density can both be controlled despite their intimate relation to one another. In FIG. 9, exemplary semiconductor wafer 600 has been cross-sectioned so that two different circuit devices are sectioned therethrough: i) NMOS transistor 602; and ii) DMOS transistor 604. In addition to transistors 602, 604, isolation grid structure 606 is cross-sectioned therethrough. The depicted cross-sectional view shows that semiconductor wafer 600 has been processed at least through the step in which the n-type region of the D-well has been inverted to p-type. The depicted embodiment shows two adjacent isolation grid contacts 608 within isolation grid structure 606.

Such a structure can facilitate control of pattern density and/or pattern uniformity when the isolation grid structure spans a large lateral distance, for example. In such a large-lateral-expanse scenario, etching the polysilicon over the entire region can cause micro loading problems, for example. In some embodiments, it can be beneficial to leave some polysilicon regions unetched within such a large lateral expanse to control the polysilicon-pattern density and/or polysilicon-pattern uniformity, for example. The physical designer might wish to balance these considerations, perhaps along with considerations related to prior etch steps to optimize process control of one or more processing steps.

While the invention has been described with reference to an exemplary embodiment(s), it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of controlling an etch-pattern density of a polysilicon layer on a surface of a semiconductor wafer for facilitating process control of a polysilicon-etch processing step, the method comprising the steps of:
    depositing the polysilicon layer on the surface of the semiconductor wafer, wherein the semiconductor wafer comprises circuit-device areas and non-circuit-device areas, the circuit-device areas having active or passive electronic devices manufactured thereon, and the non-circuit-device areas having no active or passive electronic devices manufactured thereon;
    determining polysilicon-etch regions within the circuit-device areas, the determined polysilicon-etch regions including one or more source regions of one or more DMOS devices;
    calculating an etch area of the polysilicon-etch regions;
    comparing the calculated etch area of the polysilicon-etch regions to a predetermined minimum etch area;
    adding the polysilicon-etch regions within the non-circuit-device areas to the determined polysilicon-etch regions within the circuit-device areas until the comparing step results in the calculated etch area of the polysilicon-etch regions being greater than the predetermined minimum etch area; and
    etching the polysilicon from the polysilicon-etch regions in both the circuit-device areas and the non-circuit-device areas.

2. The method of claim 1, further comprising:
    implanting a doubly-diffused well (D-well) into the polysilicon-etch regions in both the circuit-device areas and the non-circuit-device areas after etching has been performed, wherein the D-well includes both an n-type dopant species and a p-type dopant species.

3. The method of claim 2, wherein the n-type dopant species is shallower than the p-type dopant species.

4. The method of claim 1, wherein the added polysilicon-etch regions within non-circuit-device areas include regions that have substrate contacts manufactured thereon.

5. The method of claim 4, further comprising:
implanting the polysilicon-etch regions that have substrate contacts manufactured thereon with a p-type dopant species to counter dope a shallow n-type dopant species, wherein an implant dose of the p-type dopant species is sufficient to invert a net dopant concentration of the regions that have substrate contacts manufactured thereon from n-type to p-type.

6. The method of claim 1, wherein the added polysilicon-etch regions within the non-circuit-device areas include regions that have bond-pads manufactured thereon.

7. The method of claim 1, wherein the added polysilicon-etch regions within the non-circuit-device areas include scribe-street regions.

8. The method of claim 1, wherein the predetermined minimum etch area is determined such that the area of the polysilicon-etch regions is sufficient to provide an automatic end-point detection signal greater than a predetermined minimum threshold to be used by an automatic process control controller.

9. A semiconductor device made by the method of claim 1, the semiconductor device comprising:
circuit-devices including the one or more DMOS devices, each of the one or more DMOS devices having a source, a drain, and a polysilicon gate, each of the polysilicon gates having an active gate length, each of the active gate lengths being determined on one end by an edge of the polysilicon gate created by the etching step;
circuit-device polysilicon structures that overlap the circuit-device areas and are electrically connected to at least one of the circuit-devices; and
non-circuit-device polysilicon structures that do not overlap the circuit-device areas.

10. A semiconductor device of claim 9, wherein, during operation of the semiconductor device, the non-circuit-device polysilicon structures carry substantially zero current.

11. The semiconductor device of claim 9, wherein the non-circuit-device polysilicon structures are electrically connected to a substrate or to a supply pad.

12. A method of controlling an etch-pattern density of a polysilicon layer on a surface of a semiconductor wafer for facilitating process control of a polysilicon-etch processing step, the method comprising the steps of:
depositing the polysilicon layer on the surface of the semiconductor wafer, wherein the semiconductor wafer comprises circuit-device areas and non-circuit-device areas, the circuit-device areas having active or passive electronic devices manufactured thereon, and the non-circuit-device areas having no active or passive electronic devices manufactured thereon;
determining polysilicon-etch regions within the circuit-device areas, the determined polysilicon-etch regions including one or more source regions of one or more DMOS devices;
calculating an etch-pattern density, wherein the etch-pattern density is defined as a ratio of the area of the polysilicon-etch regions to an area of the top surface of the semiconductor;
comparing the calculated etch-pattern density of the polysilicon-etch regions to a predetermined minimum etch-pattern density;
adding the polysilicon-etch regions within the non-circuit-device areas to the determined polysilicon-etch regions within the circuit-device areas until the comparing step results in the calculated etch-pattern density of the polysilicon-etch regions being greater than the predetermined minimum etch-pattern density; and
etching the polysilicon from the polysilicon-etch regions in both the circuit-device areas and the non-circuit-device areas.

13. The method of claim 12, wherein the etch-pattern density calculated using the predetermined minimum area of the polysilicon-etch regions is greater than 5 percent.

14. The method of claim 12, wherein the etch-pattern density calculated using the predetermined minimum area of the polysilicon-etch regions is greater than 10 percent.

15. The method of claim 12, wherein the etch-pattern density calculated using the predetermined minimum area of the polysilicon-etch regions is greater than 20 percent.

16. The method of claim 12, wherein the polysilicon-etch regions are distributed throughout the wafer so as to provide a substantially-uniform un-etched-polysilicon density subsequent to etching the polysilicon, whereby the substantially-uniform un-etched-polysilicon density facilitates process control of a subsequent Chemical Mechanical Planarization (CMP) step.

17. A semiconductor device comprising:
a top surface having a top-surface area which includes:
circuit-device areas having active or passive electronic devices manufactured thereon;
non-circuit-device areas having no active or passive electronic devices manufactured thereon;
a polysilicon layer that has been selectively etched leaving un-etched polysilicon structures that include both circuit-device polysilicon structures and non-circuit-device polysilicon structures, wherein each of the circuit-device polysilicon structures overlaps one of the circuit-device areas and is electrically connected to one of the active or passive electronic devices, and wherein each of the non-circuit-device polysilicon structures does not overlap any of the circuit-device areas; and
one or more DMOS devices, wherein each of the one or more DMOS devices has a source, a drain, and a polysilicon gate, wherein the source has a doubly-diffused implant masked on one end by the polysilicon gate, wherein the doubly-diffused implant includes both a p-type dopant species and an n-type dopant species, wherein each of the polysilicon gates has a gate length determined on one end by an etched edge of the one end of the polysilicon gate,
wherein a ratio of an area both the circuit-element polysilicon structures and the non-circuit-element polysilicon structures to the top-surface area of the semiconductor device is greater than a predetermined threshold.

18. The semiconductor device of claim 17, further comprising:
a substrate-contact region having the doubly-diffused implant, wherein the substrate contact region has a further p-plus implant counter-doping the n-type dopant species of the doubly-diffused implant, wherein a dose of the p-type implant is sufficient to invert the net doping of the substrate-contact region in which the n-type dopant species resides.

19. The semiconductor device of claim 17, wherein the predetermined threshold is greater than 5%.

20. The semiconductor device of claim 17, wherein the predetermined threshold is greater than 10%.

* * * * *